US011022626B2

(12) United States Patent
Shin

(10) Patent No.: US 11,022,626 B2
(45) Date of Patent: Jun. 1, 2021

(54) TESTING DEVICE

(71) Applicant: LEENO INDUSTRIAL INC., Busan (KR)

(72) Inventor: Jung-Chul Shin, Changwon-si (KR)

(73) Assignee: LEENO INDUSTRIAL INC.

( * ) Notice: Subject to any disclaimer, the term of this patent is extended or adjusted under 35 U.S.C. 154(b) by 238 days.

(21) Appl. No.: 16/282,528

(22) Filed: Feb. 22, 2019

(65) Prior Publication Data

US 2019/0187177 A1    Jun. 20, 2019

Related U.S. Application Data

(63) Continuation of application No. PCT/KR2017/009375, filed on Aug. 28, 2017.

(30) Foreign Application Priority Data

Sep. 1, 2016   (KR) .................. 10-2016-0112668

(51) Int. Cl.
*G01R 31/00*   (2006.01)
*G01R 1/04*   (2006.01)
(Continued)

(52) U.S. Cl.
CPC ........... *G01R 1/0466* (2013.01); *G01R 1/073* (2013.01); *G01R 31/2601* (2013.01)

(58) Field of Classification Search
CPC ............ G01R 31/2601; G01R 31/2891; G01R 31/2861; G01R 31/2893; G01R 31/2806;
(Continued)

(56) References Cited

U.S. PATENT DOCUMENTS 5,997,316 A * 12/1999 Kunzel ................ G01R 1/0483
439/331
7,651,349 B2 *  1/2010 Hsu ...................... G01R 1/0466
439/152
(Continued)

FOREIGN PATENT DOCUMENTS

JP    2001-051014 A    2/2001
JP    2002-260798 A    9/2002
(Continued)

OTHER PUBLICATIONS

Japanese Office Action (JP 2019-529830), JPO, dated Jan. 28, 2020.
(Continued)

*Primary Examiner* — Thang X Le
(74) *Attorney, Agent, or Firm* — Park & Associates IP Law, P.C.

(57) ABSTRACT

Disclosed is a testing device. The testing device includes a testing socket configured to support a plurality of probes, a testing-circuit substrate which includes a contact point to contact the probe, a slider which makes the testing socket be coupled to and separated from the testing-circuit substrate, and a slider operator which includes a main body arranged on the testing socket, and a slider pressing portion up/down-movably supported on the main body and moving down from the main body toward the slider so that the slider can slide along a surface direction of the testing socket.

7 Claims, 6 Drawing Sheets

(51) Int. Cl.
*G01R 1/073* (2006.01)
*G01R 31/26* (2020.01)

(58) Field of Classification Search
CPC ............ G01R 31/0441; G01R 31/0466; G01R 31/073; G01R 31/07371; G01R 31/07378; G01R 31/0433; G01R 31/0458; G01R 31/0483

See application file for complete search history.

(56) References Cited

U.S. PATENT DOCUMENTS

| 2008/0233788 | A1* | 9/2008 | Chang | H05K 7/1053 |
| | | | | 439/331 |
| 2011/0028019 | A1 | 2/2011 | Hwang | |
| 2011/0171840 | A1* | 7/2011 | Sakai | G01R 1/0483 |
| | | | | 439/68 |
| 2012/0058683 | A1* | 3/2012 | Suzuki | G01R 1/0466 |
| | | | | 439/660 |
| 2013/0252450 | A1* | 9/2013 | Lin | H05K 7/10 |
| | | | | 439/330 |
| 2015/0139722 | A1 | 5/2015 | Yamada et al. | |

FOREIGN PATENT DOCUMENTS

| JP | 2004-111214 A | 4/2004 |
| KR | 10-2006-0039630 A | 5/2006 |
| KR | 10-0715459 B1 | 5/2007 |
| KR | 10-1189603 B1 | 10/2012 |
| KR | 10-1199018 B1 | 11/2012 |
| KR | 10-2013-0123193 A | 11/2013 |
| KR | 10-1504961 B1 | 3/2015 |
| TW | 200946917 A | 11/2009 |
| WO | 2013/175824 A1 | 11/2013 |

OTHER PUBLICATIONS

Korean Office Action (KR 10-2016-0112668), KIPO, dated Dec. 18, 2017.
International Search Report (PCT/KR2017/009375), WIPO, dated Dec. 28, 2017.
Korean Decision to Grant (KR 10-2016-0112668), KIPO, dated May 1, 2018.

* cited by examiner

TESTING DEVICE

REFERENCE TO RELATED APPLICATIONS

This is a continuation of pending International Patent Application PCT/KR2017/009375 filed on Aug. 28, 2017, which designates the United States and claims priority of Korean Patent Application No. 10-2016-0112668 filed on Sep. 1, 2016, the entire contents of which are incorporated herein by reference.

FIELD OF THE INVENTION

The present invention relates to a testing device for testing electric characteristics of an object to be tested, such as a semiconductor, and more particularly to a slider operator for operating a slider to make a testing socket be coupled to and separated from a testing-circuit substrate.

BACKGROUND OF THE INVENTION

A testing socket for testing a semiconductor chip is used for electric connection between a terminal of the semiconductor chip and a contact point of a testing-circuit substrate for applying a test signal. Such a testing socket is internally provided with a test probe so that the terminal of the semiconductor chip can be electrically connected to the contact point of the testing-circuit substrate. To stably perform a test, the testing socket is coupled to the testing-circuit substrate by a fastening screw or the like manner.

By the way, there may be a need of separating the testing socket coupled by such a manner from a substrate for maintenance or the like reasons. In this case, it is inconvenient because of operations of loosening the fastening screw, separating the testing socket from the substrate, coupling a new socket to the substrate, etc.

To solve this problem, the present inventor has proposed a testing device for making the testing socket be coupled to and separated from the testing-circuit substrate by a slider having a locking unit (Korean Patent Application NO. 10-2016-0038495). At this time, the testing socket having for example a size of 20 mm×20 mm×4.5 mm is mounted to a groove in a testing-socket mounting frame. However, it is very inconvenient and difficult to manually handle such a very tiny testing socket while the testing socket is mounted to a small groove.

SUMMARY OF THE INVENTION

The present invention is conceived to solve the foregoing problems, and an aspect of the present invention is to provide a testing device having a slider operator for conveniently operating a slider to make a testing socket be coupled to and separated from a testing-circuit substrate.

In accordance with an embodiment of the present invention, there is provided a testing device including, a testing socket configured to support a plurality of probes, a testing-circuit substrate which includes a contact point to contact the probe, a slider which makes the testing socket be coupled to and separated from the testing-circuit substrate, and a slider operator which includes a main body arranged on the testing socket, and a slider pressing portion up/down-movably supported on the main body and moving down from the main body toward the slider so that the slider can slide along a surface direction of the testing socket.

The slider pressing portion may include an inward pressing portion for making the slider move toward an inside of the testing socket, and an outward pressing portion for making the slider move toward an outside of the testing socket.

The slider may include a first inclined surface inclined upward from an outside of the testing socket to an inside, and a second inclined surface spaced apart from the first inclined surface and inclined upward from the inside of the testing socket to the outside, the inward pressing portion may include a third inclined surface to be in contact with the first inclined surface, and the outward pressing portion may include a fourth inclined surface to be in contact with the second inclined surface.

The slider may move to make the testing-circuit substrate be locked to and released from the testing socket.

The testing-circuit substrate may include a plurality of support locking pins fastened to and protruding upward from a surface thereof and including a locking holder along a protruding direction and a locking stopper at a front end portion along the protruding direction, the testing socket may include a socket main body having a pin through hole, through which the support locking pin passes, and a floating plate having a pin guide hole, in which the support locking pin is inserted, and coupled to and floated above the socket main body at a predetermined height, the slider may include a locking portion engaging with the locking holder of the support locking pin inserted in the pin though hole and the pin guide hole and prevented by the locking stopper from being separated upward, and the slider pressing portion may include a locking pressing portion for pressing the slider in a locking direction so that the locking portion can engage with the locking holder, and an unlocking pressing portion for pressing the slider in a direction opposite to the locking direction so that the locked locking portion can be released from the locking holder.

The testing socket may be mounted to a socket supporting frame, and the main body may be supported on the socket supporting frame.

The testing device may further include an alignment portion for aligning the main body and the socket mounting frame with each other.

It is convenient and easy to operate the slider for coupling to and separating the test socket from the testing-circuit substrate.

DETAILED DESCRIPTION OF THE INVENTION

Below, embodiments of the present invention will be described with reference to accompanying drawings.

Figure 1:
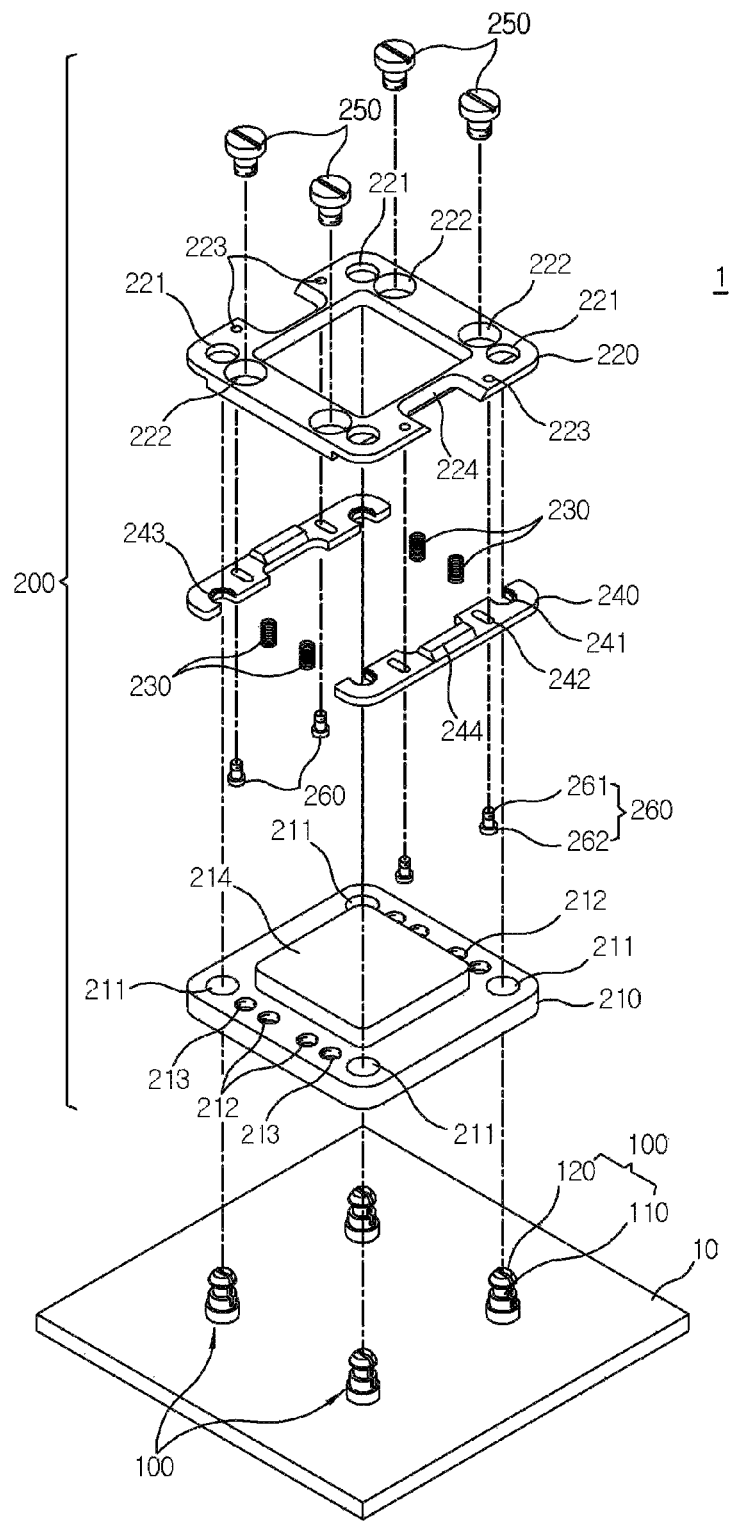
FIG. 1 is an exploded perspective view of a testing device having a slider operator according to an exemplary embodiment.

FIG. 1 is an exploded perspective view of a testing device 1 having a slider operator 300 according to an exemplary embodiment. The testing device 1 includes a testing-circuit substrate 10 and a testing socket 200. The testing socket 200 includes a socket main body 210, a floating plate 220, an elastic member 230, and a slider 240. The testing socket 200 electrically connects a contact point (not shown) of an object to be tested and a contact point (not shown) formed on the testing-circuit substrate 10 of the testing device 1. According to an exemplary embodiment, the testing socket 200 of the testing device 1 is fastened to the testing-circuit substrate 10 by coupling with a support locking pin 100.

The testing-circuit substrate 10 transmits an electric signal, power, etc. to an object to be tested (not shown) via the testing socket 200. The testing-circuit substrate 10 receives the electric signal from the object to be tested via the testing socket 200. The testing-circuit substrate 10 includes a plurality of pads (not shown) arranged to contact first ends of probes (not shown) of the testing socket 200. The testing-circuit substrate 10 includes a plurality of support locking pins 100 protruding upward from a plate surface and coupling with the testing socket 200.

The support locking pin 100 includes a locking holder 110 and a locking stopper 120 formed along a protruding direction. The locking stopper 120 is expanded from the locking holder 110 in a direction transverse to the protruding direction. For example, the locking stopper 120 is given in a stepped portion from the locking holder 110, being shaped like a holding projection. The support locking pin 100 is divided into two parts along the protruding direction. The support locking pin 100 may be elastically transformed in a direction transverse to the protruding direction. In FIG. 1, the support locking pin 100 is divided into two parts, but not limited thereto. Alternatively, the support locking pin 100 may include three or more cut-open portions. The support locking pin 100 is locked to the slider 240 (to be described later) of the testing socket 200 so that the testing-circuit substrate 10 and the testing socket 200 can be coupled to each other.

The testing socket 200 includes the socket main body 210, the floating plate 220, the elastic member 230, the slider 240, a coupling member 250, and a guide pin 260. The testing socket 200 uses the plurality of probes supported inside the socket main body 210 to electrically connect an object to be tested and the testing-circuit substrate 10.

The socket main body 210 is shaped like a rectangular plate having a probe supporter 214 like an island at the center thereof. The probe supporter 214 supports the plurality of probes (not shown). The socket main body 210 includes a pin through hole 211 provided at an outskirt of the probe supporter 214 and allowing the support locking pin 100 to pass therethrough, an elastic member accommodating groove 212 in which a first end of the elastic member 230 is inserted, and a coupling member fastening hole 213 to which the coupling member 250 is fastened.

The pin through hole 211 is formed at each corner area of the socket main body 210 to allow the support locking pin 100 to pass therethrough. The pin through holes 211 are formed as many as the number of support locking pins 100.

The elastic member accommodating groove 212 is formed on the upper surface of the socket main body 210 and opened upward to accommodate a first side of the elastic member 230. That is, the first end of the elastic member 230 is in contact with and supported on the bottom surface of the elastic member accommodating groove 212.

The coupling member fastening hole 213 screw-couples with a first end of the coupling member 250 so that the floating plate 220 can float above the socket main body 210. The coupling member 250 includes a head larger than the coupling member fastening hole 213, a main body passing through the coupling member fastening hole 213, and a screw threaded on one end portion of the main body. The floating plate 220 is shaped like a rectangular plate, a center portion of which is opened. Thus, the rectangular probe supporter 214 of the socket main body 210 is accommodated in the center portion of the floating plate 220. The floating plate 220 includes a pin guide hole 221 in which the support locking pin 100 is inserted, a coupling member through hole 222 through which the body of the coupling member 250 passes, a guide pin coupling groove 223 which couples with the guide pin 260, a cutting portion 224 which receives an operating projection 244 of the slider 240 therein. The operating projection 244 of the slider 240 is formed with first and second inclined surfaces 247 and 248 spaced apart from each other at an upper side thereof. The first and second inclined surfaces 247 and 248 are in contact with an inward pressing portion 430 and an outward pressing portion 440, respectively.

The pin guide hole 221 is formed to penetrate each outskirt of the floating plate 220 so that an end portion of the support locking pin 100 can be inserted therein. The pin guide holes 221 are formed as many as the number of support locking pins 110.

The coupling member through hole 222 accommodates the body of the coupling member 250 for coupling the socket main body 210 and the floating plate 220.

The guide pin coupling groove 223 coupled with a first end of the guide pin 260 to be described later. The guide pin coupling groove 223 may be internally screw-threaded. The guide pin 260 is coupled to the guide pin coupling groove 223 of the floating plate 220 while being inserted in a sliding slot 242 of the slider 240 to be described later.

The elastic member 230 is interposed in between the elastic member accommodating groove 212 of the socket main body 210 and the elastic member accommodating groove (not shown) of the floating plate 220. The elastic member 230 may be materialized by an elastic spring, but not limited thereto. Alternatively, the elastic member 230 may be various achieved as long as it is resilient.

The cutting portion 224 is inward recessed along a circumference of the floating plate 220. The cutting portion 224 accommodates the operating projection 244 of the slider 240 when the testing socket 200 and the support locking pin 100 are locked.

Figure 5:
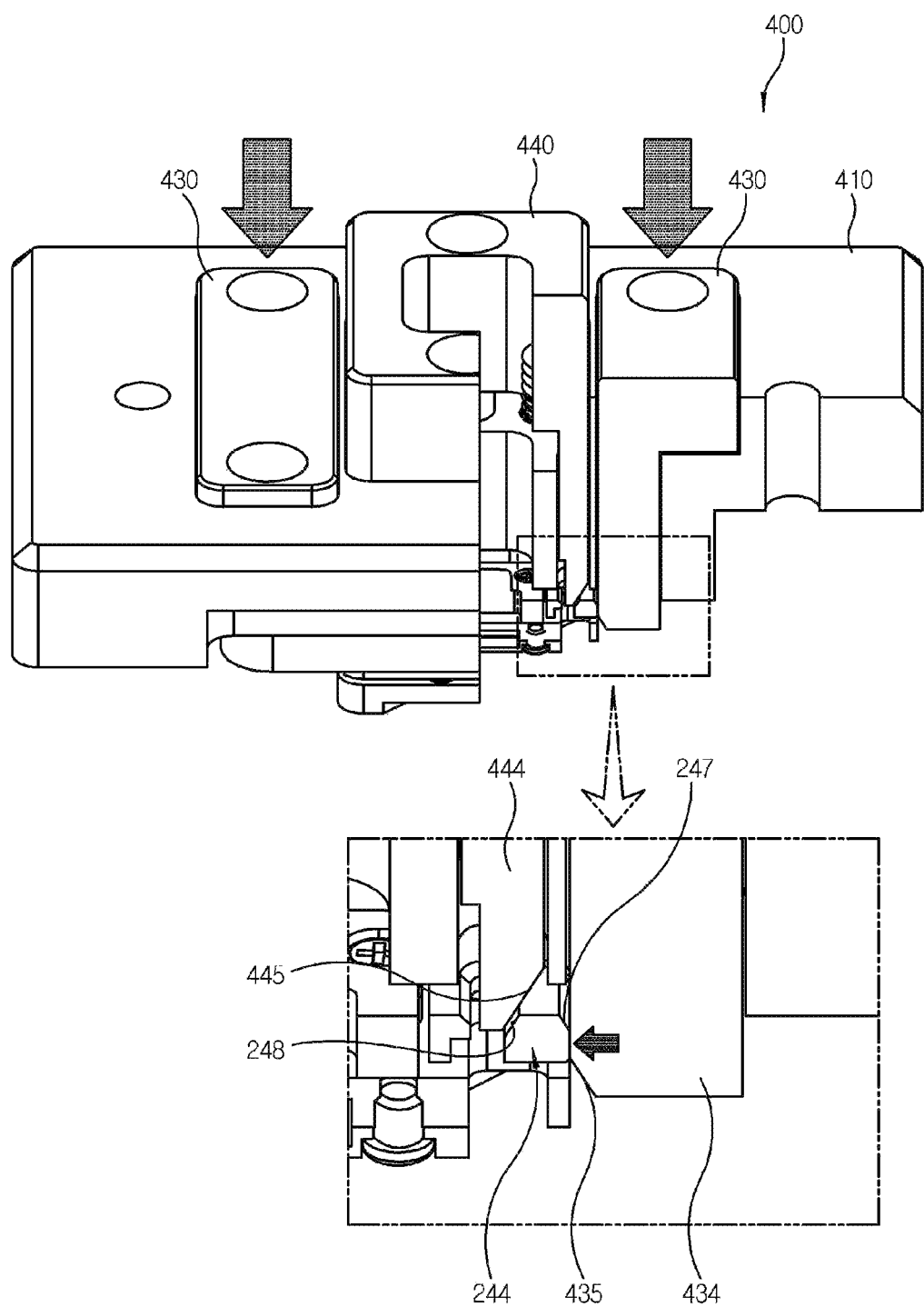
FIGS. 5 and 6 are views for explaining the operations of the slider operator of FIG. 3.
Figure 6:
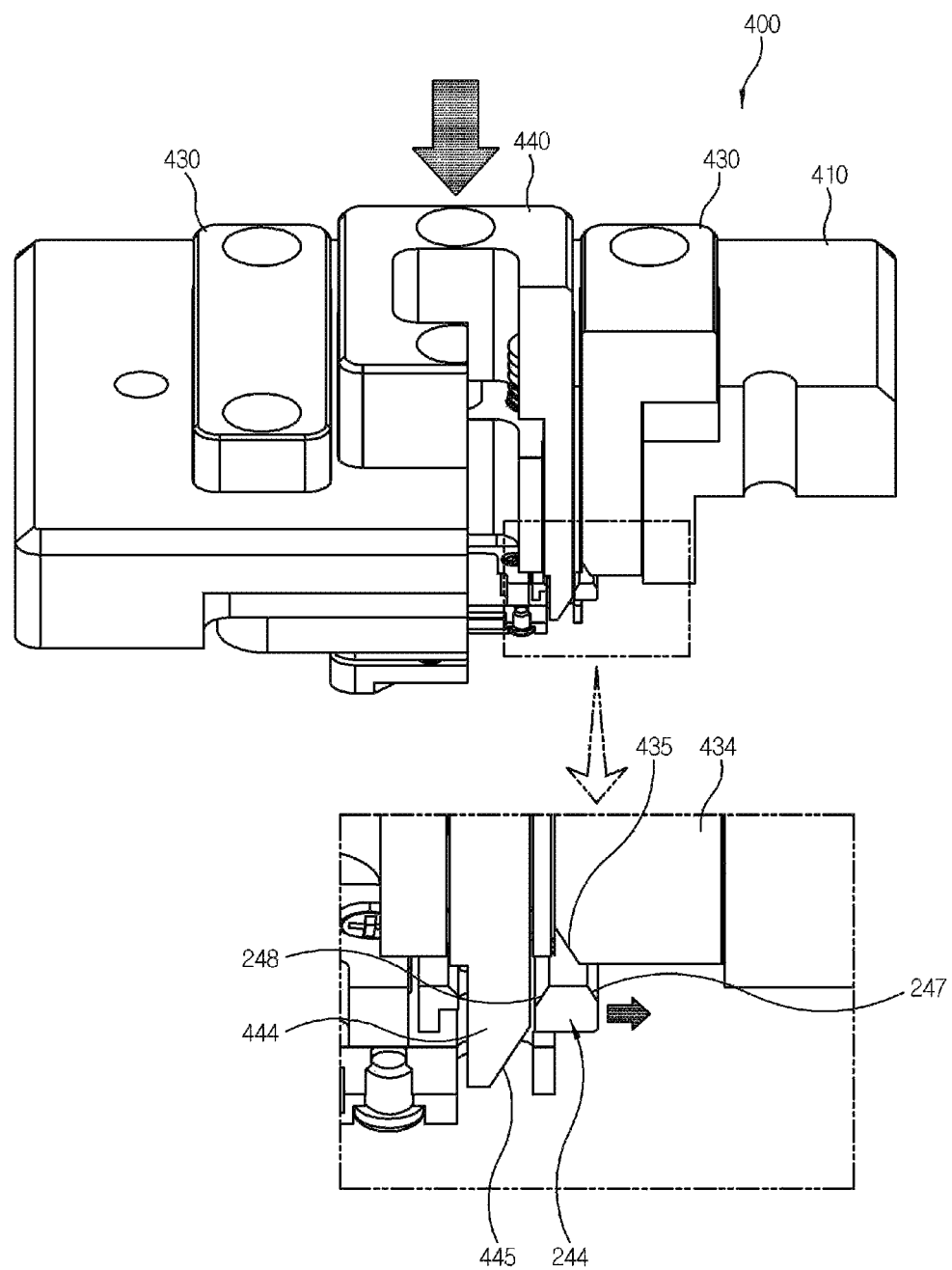

The slider 240 includes a locking portion 241, the sliding slot 242, and the operating projection 244. The slider 240 couples with the support locking pin 100 while being interposed in between the floating plate 220 and the socket main body 210. The sliders 240 may form a pair to be arranged at opposite sides of the floating plate 220. The operating projection 244 is received in the cutting portion 224 of the floating plate 220 when the testing socket 200 and the support locking pin 100 are locked. As shown in FIGS. 5 and 6, the operating projection 244 has a first inclined surface 247 at one side, and has a second inclined surface 248 at the other side. The first inclined surface 247 of the operating projection 244 is in contact with a third inclined surface 435 of an inward operating portion 434 as the inward operating portion 434 moves down. The second inclined surface 248 of the operating projection 244 is in contact with a fourth inclined surface 445 of the outward operating portion 444 as the outward operating portion 444 moves down. The slider 240 is curvedly cut at a lower side of the second inclined surface 248 formed in the operating projection 244. This curved portion allows the outward operating portion 444 moving down to push and pass by the second inclined surface 248.

The locking portion 241 is partially cut-opened having a semicircular shape to engage with the locking holder 110 of the support locking portion 100. The locking portion 241 has an engaging surface to engage with the locking holder 110, a separation preventing portion 243 to engage with the holding projection of the support locking pin 100 and prevent the slider 240 from separation, and a stopping surface to engage with the locking stopper 120. The shape of the locking portion 241 is not limited to the semicircular shape, but may vary depending on the shape of the locking holder 110.

The sliding slot 242 is formed to penetrate the slider 240 and has an elongated elliptical shape so that the guide pin 260 can pass through the sliding slot 242 and move in a surface direction.

The coupling member 250 passes through the coupling member through hole 222 and couples with the coupling member fastening hole 213 of the socket main body 210. The coupling member 250 makes the floating plate 220 couple with the socket main body 210 so that the floating plate 220 is floated above the socket main body 210. The coupling member 250 allows the floating plate 220 to move up and down while limiting upward movement of the floating plate 220 elastically urged in an upward direction.

The guide pin 260 passes through the elongated sliding slot 242 and is then coupled to the guide pin coupling groove 223 of the floating plate 220. The guide pin 260 includes a head prevented from passing through the sliding slot, a body allowed to pass through the sliding slot 242, and a screw end portion threaded on an end portion of the body and coupled to the guide pin coupling groove 223. By the guide pin 260, the slider 240 is fastened to be in close contact with the floating plate 220 and movable along the elongated sliding slot. FIG. 1 shows that the guide pin 260 passes through the sliding slot 242 formed in the slider 240, but not limited thereto. Alternatively, the sliding slot may be formed in the floating plate and the guide pin 260 may be fastened to the slider 240.

Referring to FIG. 1, the testing socket 200 is coupled to be elastically urged in a downward direction by the elastic member 230 and the coupling member 250, which are interposed in between the socket main body 210 and the floating plate 220. That is, the floating plate 220 is elastically urged in an upward direction while coupling with the socket main body 210. The upward movement of the floating plate caused by the upward elasticity is restricted by the coupling member 250. On the other hand, the downward movement of the floating plate 220 is allowed within a predetermined range when it is pressed downward. Therefore, the socket main body 210 and the floating plate 220 are not in close contact with each other but coupled leaving a certain space so that the floating plate 220 can move down within the predetermined range.

The testing device 1 allows the test socket 200 to be easily coupled to and separated from the testing-circuit substrate 10. To make the test socket 200 be coupled to the testing-circuit substrate 10, one pair of sliders 240 movable along the sliding slots 242 in the surface direction of the floating plate 220 is pushed in the inward direction of the floating plate 220 in the state that the floating plate 220 is pressed down. To make the test socket 200 be separated from the testing-circuit substrate 10, the sliders 240 are pulled in the outward direction of the socket main body 210 in the state that the floating plate 220 is pressed down.

Figure 2:
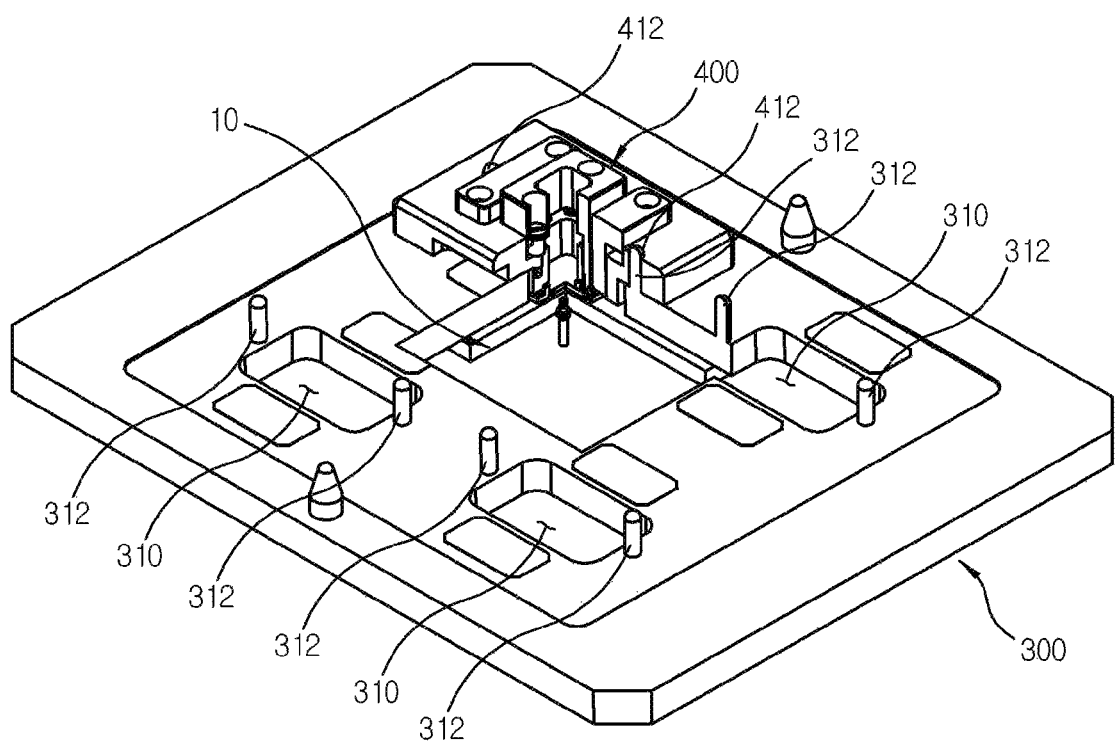
FIG. 2 is a perspective view of a socket supporting frame to which a testing socket of FIG. 1 is mounted.

FIG. 2 is a perspective view of a socket supporting frame 300 to which the testing socket 200 is mounted. As shown therein, the socket supporting frame 300 includes four socket mounting portions 310 without limitation. Each socket mounting portion 310 is provided with two alignment pins 312. Under the socket supporting frame 300, the testing-circuit substrates 10 are arranged.

The socket mounting portion 310 is shaped like a rectangular opening hole in which the testing socket 200 is seated. On the bottoms of the socket mounting portions 310, pads and the support locking pins 100 (see FIG. 1) of the testing-circuit substrate 10 are exposed. The testing socket 200 is accommodated in the socket mounting portion 310 so that the sliders 240 can be positioned at opposite short-edges of the rectangular opening hole. At this time, the support locking pin 100 is inserted in the pin through hole 211 and the pin guide hole 221 of the testing socket 200. Further, proper spaces are left at the opposite short-edge sides when the testing socket 200 having an approximately rectangular shape is inserted in the socket mounting portion 310 shaped like a rectangular opening hole. This left space serves as a space where the slider 240 operates.

According an exemplary embodiment, a slider operator 400 is mounted to the testing socket 200 by putting an alignment hole 412 of the slider operator 400 on the alignment pin 312 of the socket supporting frame 300 in the state that the testing socket 200 is accommodated in the socket mounting portion 310.

Figure 3:
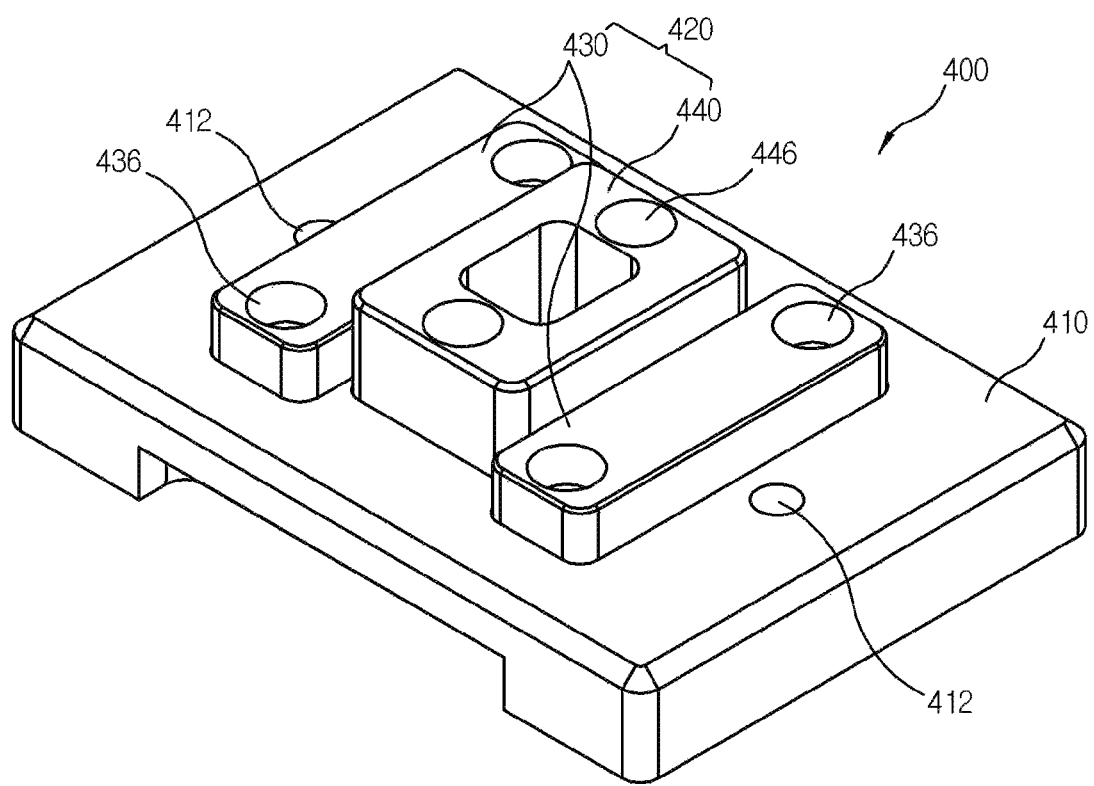
FIGS. 3 and 4 are perspective and exploded views of the slider operator according to an exemplary embodiment.
Figure 4:
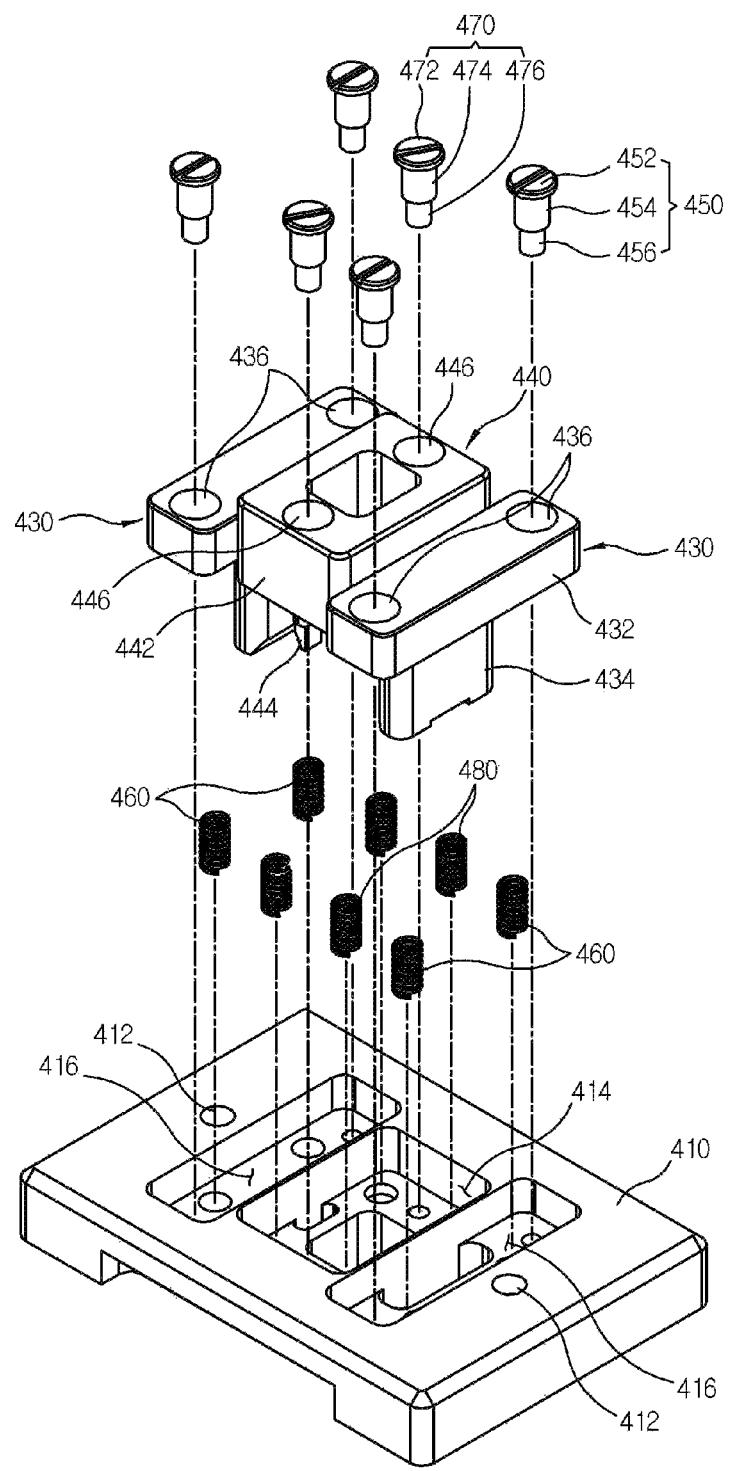

FIGS. 3 and 4 are perspective and exploded views of the slider operator 400 according to an exemplary embodiment. The slider operator 400 includes a main body 410 and a slider pressing portion 420.

The slider pressing portion 420 includes the inward pressing portion 430 for pressing the slider 240 inward along the surface direction of the testing socket 200 and the outward pressing portion 440 for pressing the slider 240 outward along the surface direction of the testing socket 200. The inward pressing portion 430 and the outward pressing portion 440 are supported on the main body 410 and elastically movable up and down.

The inward pressing portion 430 includes a pressing head 432 exposed for a press, and an inward operating portion 434 integrally and narrowly extended from the pressing head 432. The inward operating portion 434 has the third inclined surface 435 inclined downward from the inside toward the outside at an end portion thereof. The pressing head 432 is formed with a first screw hole 436 so that the inward pressing portion 430 can be floated above and mounted to the main body 410. The first screw hole 436 is penetrately formed toward the main body 410. To float the inward pressing portion 430, a first spring 460 is used. A first screw 450 includes a screw head 452, a body 454 and a screw end portion 456. The first spring 460 is interposed in between the bottom of the inward pressing portion 430 and the main body 410 (i.e. the bottom of the accommodating portion for accommodating the inward pressing portion) and provides elasticity. The body 454 of the first screw 450 passes through the inward pressing portion 430, and the screw end portion 456 is screw-coupled to the main body 410. In result, the inward pressing portion 430 is elastically floated on the main body 410 by the first spring 460 within a range corresponding to the body 454.

The outward pressing portion 440 includes a pressing head 442 exposed for a press, and two outward operating portions 444 integrally extended from the pressing head 442 and spaced apart from each other. The outward operating portion 444 has the fourth inclined surface 445 inclined upward from the inside toward the outside at an end portion thereof. The pressing head 442 is formed with a second screw hole 446 so that the outward pressing portion 440 can be floated above and mounted to the main body 410. The second screw hole 446 is formed to penetrate the outward pressing portion 440 toward the main body 410. To float the outward pressing portion 440, a second spring 480 is used. A second screw 470 includes a screw head 472, a body 474 and a screw end portion 476. The second spring 480 is interposed in between the bottom of the outward pressing portion 440 and the main body 410 (i.e. the bottom of the accommodating portion for accommodating the outward pressing portion) and provides elasticity. The body 474 of the second screw 470 passes through the outward pressing portion 440, and the screw end portion 476 is screw-coupled to the main body 410. In result, the outward pressing portion 440 is elastically floated on the main body 410 by the second spring 480 within a range corresponding to the body 474.

The main body 410 has the alignment hole 412 to be put on the alignment pin 312 of the socket supporting frame 300. The main body 410 includes a first accommodating portion 414 formed at the center thereof and accommodating the outward pressing portion 440, and two second accommodating portions 416 formed at opposite sides of the first accommodating portion 414 and respectively accommodating the two inward pressing portions 430. The first accommodating portion 414 has an upper accommodating portion in which the pressing head 442 of the outward pressing portion 440 is accommodated, and a lower accommodating hole through which the outward operating portion 444 of the outward pressing portion 440 passes. The second accommodating portion 416 has an upper accommodating portion in which the pressing head 432 of the inward pressing portion 430 is accommodated, and a lower accommodating hole through which the inward operating portion 434 of the inward pressing portion 430 passes.

Below, operations of the slider operator 400 will be describe in detail with reference to FIGS. 1, 5 and 6.

As shown in FIGS. 1 and 5, if a user presses the pressing head 432 of the opposite inward pressing portions 430 to move the slider 240 inward along the surface of the socket so that the testing socket 200 can be coupled to the testing-circuit substrate 10, the third inclined surface 435 of the inward operating portion 434 moves close to the first inclined surface 247 of the operating projection 244 of the slider 240 while compressing the first spring 460. At the same time when the pressing head 432 of the inward pressing portion 430 is pressed, the inward pressing portion 430 presses the floating plate 220. If the third inclined surface 435 is in contact with the first inclined surface 247 and continues to move, the operating projection 244 is pushed toward the socket so that the testing socket 200 can be coupled to the testing-circuit substrate 10. That is, if the inward pressing portion 430 makes the slider 240 slide toward the inside of the socket along the surface, the locking portion 241 of the slider 240 engages with and is locked to the locking holder 110 of the support locking pin 100. Then, if the pressing head 432 of the inward pressing portion 430 is released from the press, the inward pressing portion 430 and the floating plate 220 are returned to their original positions by elasticity.

As shown in FIGS. 1 and 6, if a user presses the pressing head 442 of the center outward pressing portion 440 to move the slider 240 outward along the surface of the socket so that the testing socket 200 can be separated from the testing-circuit substrate 10, the fourth inclined surface 445 of the outward operating portion 444 moves close to the second inclined surface 248 of the operating projection 244 of the slider 240 while compressing the second spring 470. At the same time when the pressing head 442 of the outward pressing portion 440 is pressed, the outward pressing portion 440 presses the floating plate 220. If the fourth inclined surface 445 is in contact with the second inclined surface 248 and continues to move, the operating projection 244 is pushed toward the outside of the socket so that the testing socket 200 can be separated from the testing-circuit substrate 10. That is, if the outward pressing portion 440 makes the slider 240 slide toward the outside of the socket along the surface, the locking portion 241 of the slider 240 gets out of and is unlocked from the locking holder 110 of the support locking pin 100. Then, if the pressing head 442 of the outward pressing portion 440 is released from the press, the outward pressing portion 440 and the floating plate 220 are returned to their original positions by elasticity.

As described above, according to an exemplary configuration of a slider operator, it is convenient and easy to operate the slider to make the small-size testing socket be coupled to and separated from the testing-circuit substrate.

Although a few exemplary embodiments have been shown and described, it will be appreciated by those skilled in the art that changes may be made in these exemplary embodiments without departing from the principles and spirit of the invention.

Therefore, the scope of the present invention has to be not limited to the foregoing exemplary embodiments but defined in the appended claims and their equivalents.

The testing device according to the present invention is useful for testing in the manufacturing process of a semiconductor.

What is claimed is:

1. A testing device comprising:
 a testing-circuit substrate comprising a plurality of support locking pins protruded upwardly from the testing-circuit substrate;
 a testing socket configured to support a plurality of probes and comprising a slider, wherein the slider includes a locking groove adapted to selectively engage to and disengage from the support locking pin when the slider is moved in a horizontal direction towards and away from the support locking pin; and
 a slider operator comprising a main body arranged on the testing socket, and a slider pressing portion vertically movably supported on the main body and configured to be moved downwardly from the main body toward the slider so that the slider can slide along the horizontal direction of the testing socket by a cam operation between the slider pressing portion and the slider to couple the testing socket to the testing-circuit substrate.

2. The testing device according to claim 1, wherein the slider pressing portion comprises an inward pressing portion for making the slider move toward an inside of the testing socket, and an outward pressing portion for making the slider move toward an outside of the testing socket.

3. The testing device according to claim 1, wherein
 the slider comprises an first inclined surface inclined upward from an outside of the testing socket to an inside, and a second inclined surface spaced apart from the first inclined surface and inclined upward from the inside of the testing socket to the outside,
 the inward pressing portion comprises a third inclined surface to be in contact with the first inclined surface, and
 the outward pressing portion comprises a fourth inclined surface to be in contact with the second inclined surface.

4. The testing device according to claim 1, wherein the slider operator is further configured to move the slider in an opposite direction so that the testing-circuit substrate is released from the testing socket.

5. The testing device according to claim 4, wherein
the testing-circuit substrate comprises a plurality of support locking pins fastened to and protruding upward from a surface thereof and comprising a locking holder along a protruding direction and a locking stopper at a front end portion along a protruding direction,
the testing socket comprises a socket main body having a pin through hole, through which the support locking pin passes, and a floating plate having a pin guide hole, in which the support locking pin is inserted, and coupled to and floated above the socket main body at a predetermined height,
the slider comprises a locking portion engaging with the locking holder of the support locking pin inserted in the pin though hole and the pin guide hole and prevented by the locking stopper from being separated upward, and
the slider pressing portion comprises a locking pressing portion for pressing the slider in a locking direction so that the locking portion can engage with the locking holder, and an unlocking pressing portion for pressing the slider in a direction opposite to the locking direction so that the locked locking portion can be released from the locking holder.

6. The testing device according to claim 1, wherein the testing socket is mounted to a socket supporting frame, and the main body is supported on the socket supporting frame.

7. The testing device according to claim 6, further comprising an alignment portion for aligning the main body and the socket mounting frame with each other.

* * * * *